United States Patent [19]

Taylor

[11] Patent Number: 4,808,853

[45] Date of Patent: Feb. 28, 1989

[54] TRISTATE OUTPUT CIRCUIT WITH SELECTABLE OUTPUT IMPEDANCE

[75] Inventor: Stewart S. Taylor, Beaverton, Oreg.

[73] Assignee: TriQuint Semiconductor, Inc., Beaverton, Oreg.

[21] Appl. No.: 125,272

[22] Filed: Nov. 25, 1987

[51] Int. Cl.⁴ ............... H03K 17/16; H03K 19/094; H03K 19/02

[52] U.S. Cl. ............... 307/473; 307/443; 307/451; 307/452

[58] Field of Search ............... 307/443, 451–452, 307/473

[56] References Cited

U.S. PATENT DOCUMENTS 4,644,196 8/1988 Flannagan ............... 307/473

Primary Examiner—John Zazworsky
Assistant Examiner—M. R. Wambach
Attorney, Agent, or Firm—William S. Lovell; Daniel J. Bedell; Peter J. Meza

[57] ABSTRACT

A tristate output circuit includes a pair of transistors having sources connected to a switchable current source and drains separately coupled to a voltage source through separate resistors and switching transistors. When the current source and switching transistors are on, the circuit operates in a back termination mode wherein it amplifies a differential input signal applied across the gates of the transistor pair to produce a differential output signal across their drains for transmission on a transmission line. The load resistors are sized to match the characteristic impedance of a transmission line so as to properly terminate the transmission line. In an open drain mode, the switching transistors are off, uncoupling the drains of the transistor pair from the voltage source so as to increase output impedance. In a tristate mode, the current source and switching transistors are turned off, thereby turning off the transistor pair and rendering the output impedance of the circuit substantially infinite.

6 Claims, 1 Drawing Sheet

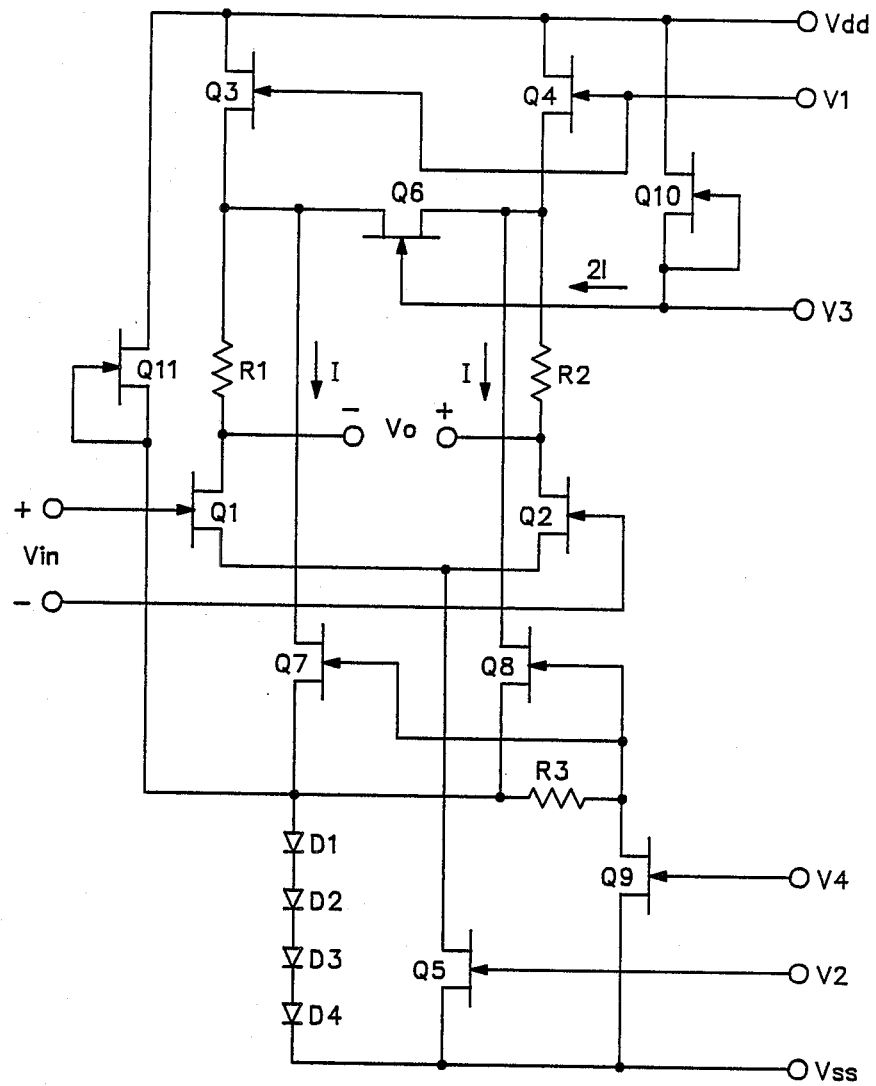

TRISTATE OUTPUT CIRCUIT WITH SELECTABLE OUTPUT IMPEDANCE

BACKGROUND OF THE INVENTION

The present invention relates in general to tristate output circuits and in particular to a tristate output circuit having selectable output impedance.

The output stage of a logic or a pulse circuit typically comprises an amplifier or switching circuit that provides an output to a load, and one of the more important features thereof is its output impedance. For example, in many applications a relatively high output impedance is desired. On the other hand, when an output circuit supplies a signal to a constant impedance transmission line, it may be preferable that its output impedance match the impedance of the transmission line so that it back terminates the line for absorbing reflections.

A tristate output circuit has two modes of operation. In a normal mode of operation, it acts as a conventional output stage providing a signal to a load through its output impedance. In the tristate mode of operation, no output signal is produced and the output impedance is "disconnected" in some fashion from external circuitry so that it does not act as a load. Tristate circuits are often used to multiplex signals onto a bus and when an output signal from one tristate output circuit is currently driving the bus, other output circuits connected to the bus may be "tristated" so that their output impedances do not act as loads to the circuit driving the bus. Use of tristate output circuits in such applications minimizes the amount of power that each output circuit must provide in order to drive the transmission line. Tristate output circuits of the prior art typically include transmission gates in their output signal paths for selectively disconnecting their output terminals from external loads. However, capacitance and resistance associated with these transmission gates tend to distort, attenuate and filter the output signals and limit the ability of the tristate output circuit effectively to back terminate a transmission line.

SUMMARY OF THE INVENTION

In accordance with an aspect of the invention, a tristate output circuit includes first and second JFET transistors. The drain terminal of the first transistor is tied to one end of a first load resistor, and the second end of the first load resistor is selectively coupled to a first voltage supply by a third transistor. Similarly, the drain terminal of the second transistor is attached to an end of a second load resistor, the second end of which is selectively coupled to the first voltage supply through a fourth transistor. The source terminals of the first and second transistors are coupled to a second voltage supply through a fifth transistor, and the second ends of the two load resistors are interconnected through a sixth transistor. The gate terminals of the third, fourth, fifth and sixth transistors are controlled by externally generated signals.

In a "back termination" mode of operation, the third, fourth, fifth and sixth transistors are all turned on by the control signals supplied at their gate terminals, and a differential input signal applied across the gate terminals of the first and second transistors controls a differential output signal developed between the drain terminals of the first and second transistors. The two load resistors suitably have resistances matched to the characteristic impedance of a transmission line or bus that carries the output signal from the circuit, and the sixth transistor is sized for low impedance so that it maintains the second terminals of the two load resistors at substantially constant and substantially similar voltages. In this mode, the two load resistors back terminate the transmission line for absorbing reflections thereon and minimizing signal distortion.

In an open drain mode of operation, the third, fourth and sixth transistors are turned off so that the two load resistors are effectively disconnected from the first voltage supply and from one another. In this mode, the output impedance of the circuit is maximized, while the first, second and fifth transistors provide a current to an external load.

In a tristate mode of operation, the third, fourth, fifth and sixth transistors are all turned off, thereby effectively disconnecting the circuit from the transmission line or bus for minimizing the load the circuit provides to other output circuits also driving the transmission line or bus. The output impedance of the circuit has minimal parasitic resistance or capacitance in all modes of operation and therefore permits high speed operation of the transmission line or bus. Such parasitic resistance or capacitance that is included in the circuit has minimal impact on the output impedance of the circuit.

It is accordingly an object of the invention to provide an improved tristate output circuit having an output impedance that effectively back terminates a transmission line when the circuit is operating in a back termination mode, which output impedance may be disconnected from the transmission line during tristate or open drain modes of operation.

The subject matter of the present invention is particularly pointed out and distinctly claimed in the concluding portion of this specification. However, both the organization and method of operation of the invention, together with further advantages and objects thereof, may best be understood by reference to the following description taken in connection with the accompanying drawing wherein like reference characters refer to like elements.

BRIEF DESCRIPTION OF THE DRAWING

The single drawing FIGURE is a circuit diagram of a tristate output circuit in accordance with the present invention.

DESCRIPTION OF THE PREFERRED EMBODIMENT

With reference to the drawing, a tristate output circuit comprises a set of depletion mode, junction field-effect transistors (FETs) Q1–Q10. The drain terminal of transistor Q1 is coupled through a first load resistor R1 to the source terminal of transistor Q3, and the drain terminal of transistor Q3 is tied to a first (suitably positive) voltage supply Vdd. Similarly, the drain terminal of transistor Q2 is coupled through a second load resistor R2 to the source terminal of transistor Q4, the drain terminal of transistor Q4 also being connected to Vdd. The source terminals of transistors Q1 and Q2 are connected to one another and to the drain terminal of transistor Q5, while the source terminal of transistor Q5 is tied to a second (suitably negative) voltage supply Vss. The source terminals of transistors Q3 and Q4 are connected to the source terminal and drain terminal, respectively, of transistor Q6, as well as to the drain terminals of transistors Q7 and Q8. The source terminals of transistors Q7 and Q8 are coupled to one another and, through a set of four diodes D1-D4 in series, to supply voltage Vss. A transistor Q11 has its drain connected to Vdd and its source and gate connected to D1 to provide biasing current to diodes D1-D4 to ensure they are always forward biased. The drain terminal of transistor Q9 is connected to the gate terminals of transistors Q7 and Q8 while also being coupled to the source terminals of transistors Q7 and Q8 through a third resistor R3. The source terminal of transistor Q9 is returned to supply voltage Vss.

A first control signal V1 drives the gate terminals of transistors Q3 and Q4. Second, third, and fourth control signals V2, V3 and V4 drive the gate terminals of transistors Q5, Q6, and Q9, respectively. When control signals V1, V2 and V3 are high and control signal V4 is low, transistors Q3-Q8 and Q10 are active and transistor Q9 is off whereby the circuit operates in a "back termination" mode. In this mode, a differential voltage input signal Vin applied across the gate terminals of transistors Q1 and Q2 switches transistors Q1 and Q2 to produce a differential voltage output signal Vo between the drain terminals of transistors Q2 and Q1. The output signal Vo is suitably provided via constant impedance transmission lines to an external load. Transistor Q5 acts as a current source, and the magnitude of its drain current is controlled by the magnitude of control signal V2 in relation to supply voltage Vss. The relative proportion of the drain current of transistor Q5 flowing through resistors R1 and R2 is governed by input signal Vin. When the input signal Vin magnitude is positive as shown, transistor Q1 conducts substantially all of the drain current supplied via transistor Q5, the drain terminal voltage of transistor Q1 is pulled lower than the drain terminal voltage of transistor Q2, and output signal Vo is positive. When input signal Vin magnitude swings negative, transistor Q2 conducts substantially all of the drain current supplied to transistor Q5, the drain terminal voltage of transistor Q2 falls below the drain terminal voltage of transistor Q1, and output signal Vo swings negative.

Transistor Q10 acts as a current source producing a current of magnitude 2I at the gate of transistor Q6 when control signal V3 is high, which current is of sufficient magnitude to ensure transistor Q6 conducts as a low impedance switch. Transistors Q7 and Q8 are current sources each conducting a drain current of magnitude I (determined by suitably choosing their widths to be one half that of transistor Q10) which approximately matches the currents from the source terminal and drain terminal of transistor Q6 supplied by transistor Q10, thereby ensuring that the gate current of transistor Q6 is not transmitted through resistors R1 and R2 so as to affect output voltage Vo. Transistors Q3 and Q4 operate in saturation when control signals V1 and V3 are high and are sized to provide moderate to low dynamic impedance when active.

Transistor Q6 is sized large enough to suitably minimize its drain-to-source terminal impedance when it is conducting. Since transistor Q6 provides a low impedance path between the source terminals of transistors Q3 and Q4, the potentials at the source terminals of transistors Q3 and Q4 are nearly equal and remain substantially constant over the full range of positive and negative magnitudes of input signal Vin. The values of resistors R1 and R2 are selected to match the characteristic impedance of transmission lines driven by output signal Vo. Since resistors R1 and R2 match the characteristic impedance of the transmission lines, and since the upper terminals of resistors R1 and R2 are connected to nodes of constant, substantially similar, potential, resistors R1 and R2 provide a high quality back termination for absorbing reflections on the transmission lines.

When control signals V1 and V3 are driven low, and control signals V2 and V4 are driven high, transistors Q3, Q4, and Q6-Q8 are off, and transistors Q5 and Q9 are on. Transistors Q3 and Q4 disconnect resistors R1 and R2 from Vdd and transistor Q6 decouples resistors R1 and R2. In such case, the circuit operates in an "open drain" mode whereby its output impedance is high inasmuch as such impedance comprises only the impedances of transistors Q1 and Q2 and not that of resistors R1 and R2. In this mode, the circuit does not provide matched back termination for the transmission line but its output voltage and current swings are maximized and its own power consumption is minimized.

To place the circuit in a "tristate" mode, control signals V1-V3 are all driven low for turning transistors Q3, Q4, Q5 and Q6 off, and control signal V4 is driven high to turn transistor Q9 on. As transistor Q9 turns on, it pulls the gate terminal voltage of transistors Q7 and Q8 below the source terminal voltages and consequently transistors Q7 and Q8 are turned off. (Diodes D1-D4 are provided to level shift the source terminal voltages of transistors Q7 and Q8 above supply voltage Vss whereby they turn off when their gate terminal voltages are pulled down. In the tristate mode, the circuit does not amplify the input signal since transistors Q1, Q2 and Q5 are off and the stage's output impedance is very high. In the tristate mode, the circuit does not supply a signal to the external load line and presents a very high impedance load to any other circuit that may be connected to the external load.

An output circuit has been described that operates selectively in either a back termination mode, an open drain mode or a tristate mode. In the back termination mode, it amplifies an input voltage to provide a differential output voltage through an output impedance that properly back terminates the transmission lines. In the open drain mode, it provides a large output current signal through high output impedance, and in the tristate mode, the circuit does not provide an output signal and has very large output impedance.

It will be appreciated that diodes D1-D4 and Q11 may be replaced with a DC voltage source of suitable magnitude or any other level shifting means. In addition, while the preferred embodiment of the invention employs depletion mode JFET transistors, it should be understood other types of transistors such as, for example, enhancement mode JFETs, MOSFETs, GaAsFETs and bipolar transistors may be utilized instead, with suitable adjustments to control signal and supply voltage levels and other circuit modifications to provide appropriate transistor biasing as would be apparent to those skilled in the art. When transistors having very low impedances are employed, such as for example bipolar transistors, transistors Q6-Q11, diodes D1-D4 and resistor R3 may be omitted.

Accordingly, while a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. A tristate output circuit for providing an output voltage signal to a constant impedance transmission line in response to an input voltage signal and first, second, and third control signals, comprising:

a source of first supply voltage;

a source of second supply voltage;

first and second resistors each having resistance suitably matched to the characteristic impedance of the transmission line;

first transistor means having a control terminal and first and second load terminals for conducting a first load current between its first and second load terminals;

second transistor means having a control terminal and first and second load terminals for conducting a second load current between its first and second load terminals;

the second load terminals of said first and second transistor means being coupled together, the input voltage signal being applied across the control terminals of said first and second transistor means for controlling the magnitudes of the first and second load currents, and the output voltage signal being produced in accordance with a potential between the first load terminals of said first and second transistor means;

first means for selectively coupling the first load terminal of said first transistor means to said source of first supply voltage through said first resistor and for selectively coupling the first load terminal of said second transistor means to said source of first supply voltage through said second resistor, selective coupling by said first means being controlled by the first control signal applied as an input thereto;

second means for selectively coupling the second load terminals of said first and second transistor means to the source of second supply voltage, selective coupling by said second means being controlled by the second control signal applied as input thereto; and third means for selectively coupling the first load terminal of said first transistor means to the first load terminal of said second transistor means through said first and second resistors in series, selective coupling by said third means being controlled by said third means being controlled by said third control signal applied as input thereto.

2. The tristate circuit in accordance with claim 1 wherein said first means comprises;

third transistor means having a control terminal and first and second load terminals for selectively conducting a third load current between its first and second load terminals, the first load terminal of said third transistor means being connected to said source of first supply voltage, said first resistor coupling the second load terminal of said third transistor means to the first load terminal of said first transistor means, the first control signal being applied to the control terminal of said third transistor means for controlling selective conduction of the third load current; and fourth transistor means having a control terminal and first and second load terminals for selectively conducting a fourth load current between its first and second load terminals, the first load terminal of said fourth transistor means being connected to said source of first supply voltage, said second resistor coupling the second load terminal of said fourth transistor means to the first load terminal of said second transistor means, the first control signal being applied to the control terminal of said fourth transistor means for controlling selective conduction of the fourth load current.

3. The tristate output circuit in accordance with claim 1 wherein said third means comprises a transistor having a control terminal and first and second load terminals, said first resistor coupling the first load terminal of said transistor to the first load terminal of said first transistor means and the second resistor coupling the second load terminal of said transistor to the first load terminal of the second transistor means, the third control signal being applied to the control terminal of said transistor for controlling the impedance between the first and second load terminals of said transistor.

4. A tristate output circuit for providing an output voltage signal to a constant impedance transmission line in response to an input voltage signal and first, second, and third control signals, comprising;

a source of first supply voltage;

a source of second supply voltage;

first and second resistors each having resistances suitably matched to the characteristic impedance of the transmission line;

first transistor means having a control terminal and first and second load terminals for conducting a first load current between its first and second load terminals;

second transistor means having a control terminal and first and second load terminals for conducting a second load current between its first and second load terminals, the second load terminals of said first and second transistor means being coupled together, the input voltage signal being applied across the control terminals of said first and second transistor means for controlling the magnitudes of the first and second load currents;

third transistor means having a control terminal and first and second load terminals for selectively conducting a third load current between its first and second load terminals, the first load terminal of said third transistor means being connected to said source of first supply voltage, said first resistor coupling the second load terminal of said third transistor means to the first load terminal of said first transistor means, the first control signal being applied to the control terminal of said third transistor means for controlling selective conduction of the third load current;

fourth transistor means having a control terminal and first and second load terminals for selectively conducting a fourth load current between its first and second load terminals, the first load terminal of said fourth transistor means being connected to said source of first supply voltage, said second resistor coupling the second load terminal of said fourth transistor means to the first load terminal of said second transistor means, the first control signal being applied to the control terminal of said fourth transistor means for controlling selective conduction of the fourth load current;

fifth transistor means having a control terminal and first and second load terminals for selectively conducting a fifth load current between its first and second load terminals, the first load terminal of said fifth transistor means being connected to the second load terminals of said first and second transistor means, the second load terminal of said fifth transistor means being connected to said source of second supply terminal of said fifth transistor means for controlling selective conduction of the fifth load current; and means for selectively conducting a sixth load current between the second load terminals of said third and fourth transistor means in accordance with a third control signal.

5. The tristate output circuit in accordance with claim 4 further responsive to a third control signal and further comprising sixth transistor means having a control terminal and first and second load terminals for selectively conducting a sixth load current between its first and second load terminals, the first load terminal of said sixth transistor means being connected to the second load terminal of said third transistor means, the second load terminal of said sixth transistor means being connected to the second load terminal of said fourth transistor means, the third control signal being applied to the control terminal of said sixth transistor means for controlling selective conduction of the sixth load current, 6. The tristate output circuit in accordance with claim 5 further responsive to a fourth control signal and further comprising:

a third resistor;

level shifting means;

seventh transistor means having a control terminal and first and second load terminals for selectively conducting a seventh load current between its first and second load terminals, the first load terminal of said seventh transistor means being connected to the first load terminal of said sixth transistor means, the second load terminal of said seventh transistor means being connected through said level shifting means to said source of second supply voltage;

eighth transistor means having a control terminal and first and second load terminals for selectively conducting an eighth load current between its first and second load terminals, the first load terminal of said eighth transistor means being connected to the second load terminal of said sixth transistor means, the second load terminal of said eighth transistor means being connected through said level shifting means to said source of second supply voltage;

ninth transistor means having a control terminal and first and second load terminals for selectively conducting a ninth control current between its first and second load terminals, the first load terminal of said ninth transistor means being connected to the control terminals of said seventh and eighth transistor means, the second load terminal of said ninth transistor means being connected to said source of second supply voltage, the fourth control signal be applied to the control terminal of said ninth transistor means for controlling selective conduction of the ninth load current; and tenth transistor means having a control terminal and first and second load terminals for selectively conducting a tenth load current between its first and second load terminals, the first load terminal of said tenth transistor means being connected to the source of first supply voltage, the second load terminal and control terminal of said tenth transistor means being connected to the control terminal of said sixth transistor means.

* * * * *